United States Patent [19]

Comtois

[11] Patent Number: 5,303,820

[45] Date of Patent: Apr. 19, 1994

[54] PACKAGING FOR PROTECTING PRINTED CIRCUIT BOARD AND OTHER PRODUCTS

[76] Inventor: Claude Comtois, 451 Iles Bélair W., Rosemere, Canada, J7A 1A5

[21] Appl. No.: 920,638

[22] Filed: Jul. 28, 1992

[51] Int. Cl.$^5$ .................. B65D 85/62; B65D 73/02
[52] U.S. Cl. .................. 206/328; 206/332; 206/334; 206/509; 206/454
[58] Field of Search ............. 206/328, 332, 334, 509, 206/454

[56] References Cited

U.S. PATENT DOCUMENTS

| 2,005,967 | 6/1935 | Berdan | 206/454 |
| 2,778,490 | 1/1957 | Emery | 206/332 |
| 5,107,989 | 4/1992 | Becker | 206/328 |

FOREIGN PATENT DOCUMENTS

| 253411 | 1/1988 | Fed. Rep. of Germany | 206/328 |
| 2105289 | 3/1983 | United Kingdom | 206/328 |

OTHER PUBLICATIONS

An Electrical Component Package (Western Electric) Technical Digest No. 64, Oct. 1981.

Primary Examiner—William I. Price

[57] ABSTRACT

A printed circuit board support frame for protecting and transporting a printed circuit board. The support frame is molded from moldable materials and comprises a base wall section having elevated support ribs on a top face thereof for supporting the printed circuit board elevated from the base wall section. The base wall section has a hinged retention side wall member formed along a pair of opposed parallel edges thereof. The retention side wall members, when hinged outwardly of the base wall, permit the circuit board to be positioned on the support ribs over the base wall section. The retention side wall members have one or more clamping shoulders projecting forwardly over opposed top side edge portions of the circuit board when the side wall members are maintained in a vertical position to clamp the circuit board over the support ribs. Abutment wall members are formed at predetermined locations on the base wall section to prevent the circuit board from displacement.

13 Claims, 3 Drawing Sheets

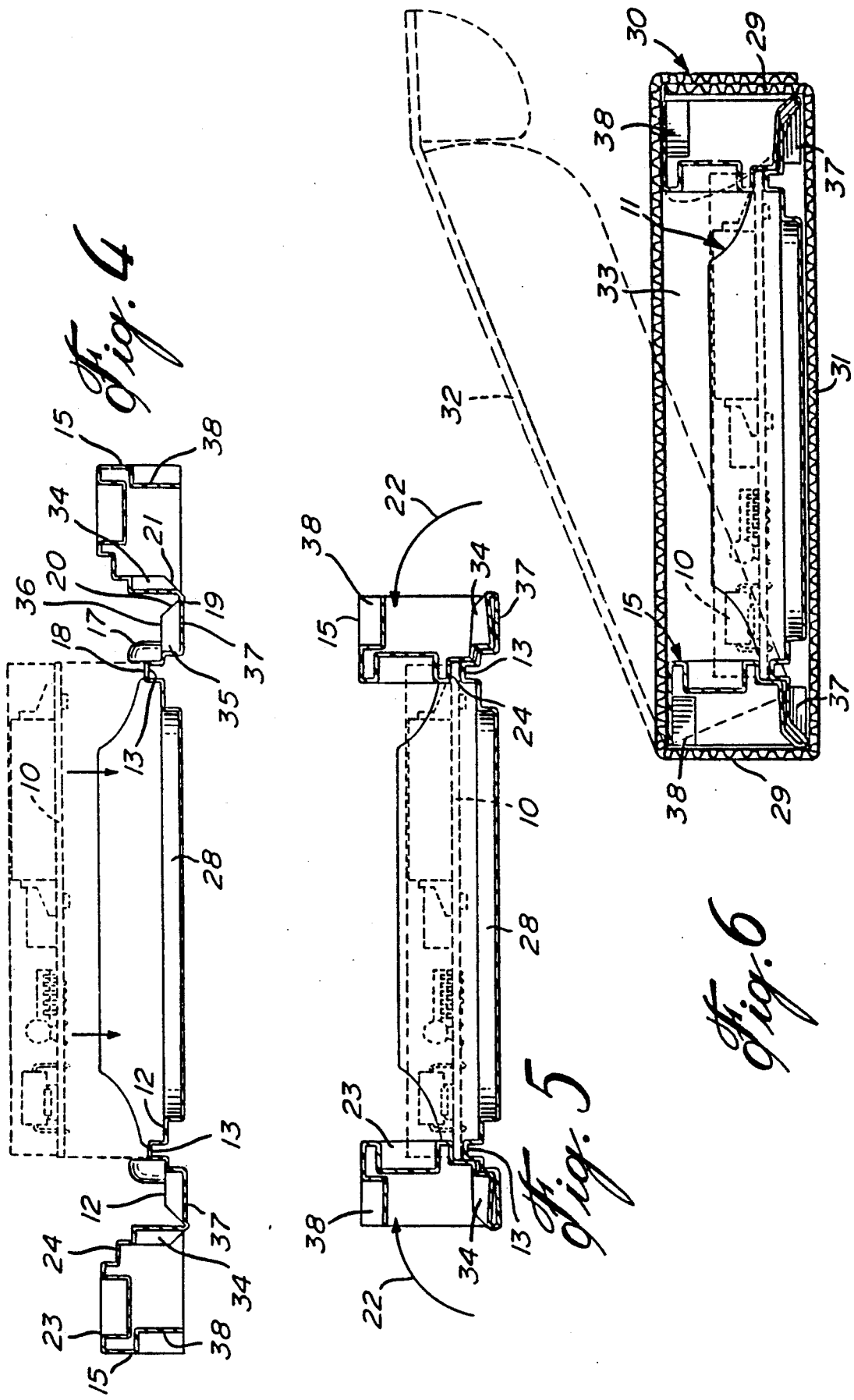

PACKAGING FOR PROTECTING PRINTED CIRCUIT BOARD AND OTHER PRODUCTS

BACKGROUND OF INVENTION

The present invention relates to a printed circuit board support frame for protecting and transporting a printed circuit board in a shipping container or for protecting the circuit board when handled by persons in the trade.

It is known to ship printed circuit boards in corrugated cartons with form cushioning material and sometimes also in plastic containers which are comprised of a base shell which supports a circuit board in an elevated fashion, usually by a contour ridge, and wherein a cover or a top shell is positioned over the bottom shell and abuts the rear side of the printed circuit board to clamp it in the support frame. The component side of the board is usually facing downwardly and spaced from the bottom wall of the bottom shell. One or a plurality of these support frames can be retained in a shipping container in a stacked fashion with the circuit boards immovable therein due to the close spacing between the side walls and top wall of the container(s).

SUMMARY OF INVENTION

As far as the clamp shell type of plastic container is concerned the present invention relates to an improved support frame of the above-mentioned type and which is formed from moldable material, such as plastics, and wherein the need to provide a cover for the support frame is eliminated thereby making the container less expensive to produce while offering excellent shock absorbing properties to the printed circuit board when transported in a shipping container.

Another feature of the present invention is to provide a printed circuit board support frame for protecting and transporting a printed circuit board and wherein the frame is molded out of a single plastic sheet and therefore has no loose parts coacting therewith to retain the board and thereby eliminating the risk of losing a part and rendering the frame unusable.

Another feature of the present invention is to provide a printed circuit board support frame for protecting and transporting a printed circuit board and wherein the printed circuit board is quickly positioned and engaged and disengaged from within the support frame.

Another feature of the present invention is to provide a printed circuit board support frame for protecting and transporting a printed circuit board and wherein the frame can be used to protect the board whether positioned within or out of a shipping container with the electronics components of printed circuit boards facing upwardly within the support frame making them visible to the user and wherein the support frame is stackable one on top of another.

According to the above features, from a broad aspect, the present invention provides a printed circuit board support frame for protecting and transporting a printed circuit board. The support frame is molded from suitable moldable material and comprises a base wall section having elevated support means projecting from a top face thereof for supporting the printed circuit board elevated from the base wall section. The base wall section has a hinged retention side wall member formed along a pair of opposed parallel edges thereof. The retention side wall members, when hinged outwardly of the base wall, permit the circuit board to be positioned on the support means elevated from the base wall section. The retention side wall members have one or more clamping means to overlie opposed top side edge portions of the circuit board when the side wall members are maintained in a vertical position to clamp the circuit board over the support means. Arresting means is provided to prevent the circuit board from displacement.

BRIEF DESCRIPTION OF DRAWINGS

A preferred embodiment of the present invention will now be described with reference to the accompanying drawings in which:

FIG. 4 is a section view across the printed circuit support frame showing the configuration of the frame and the positioning of a printed circuit over a base wall section of the frame;

FIG. 5 is a view similar to FIG. 4 but showing the hinged retention side wall members in a position of use to clamp the circuit board;

FIG. 6 is a section view through a shipping container in which the support frame with the circuit board clamped therein, is positioned.

DESCRIPTION OF PREFERRED EMBODIMENTS

Figure 1:
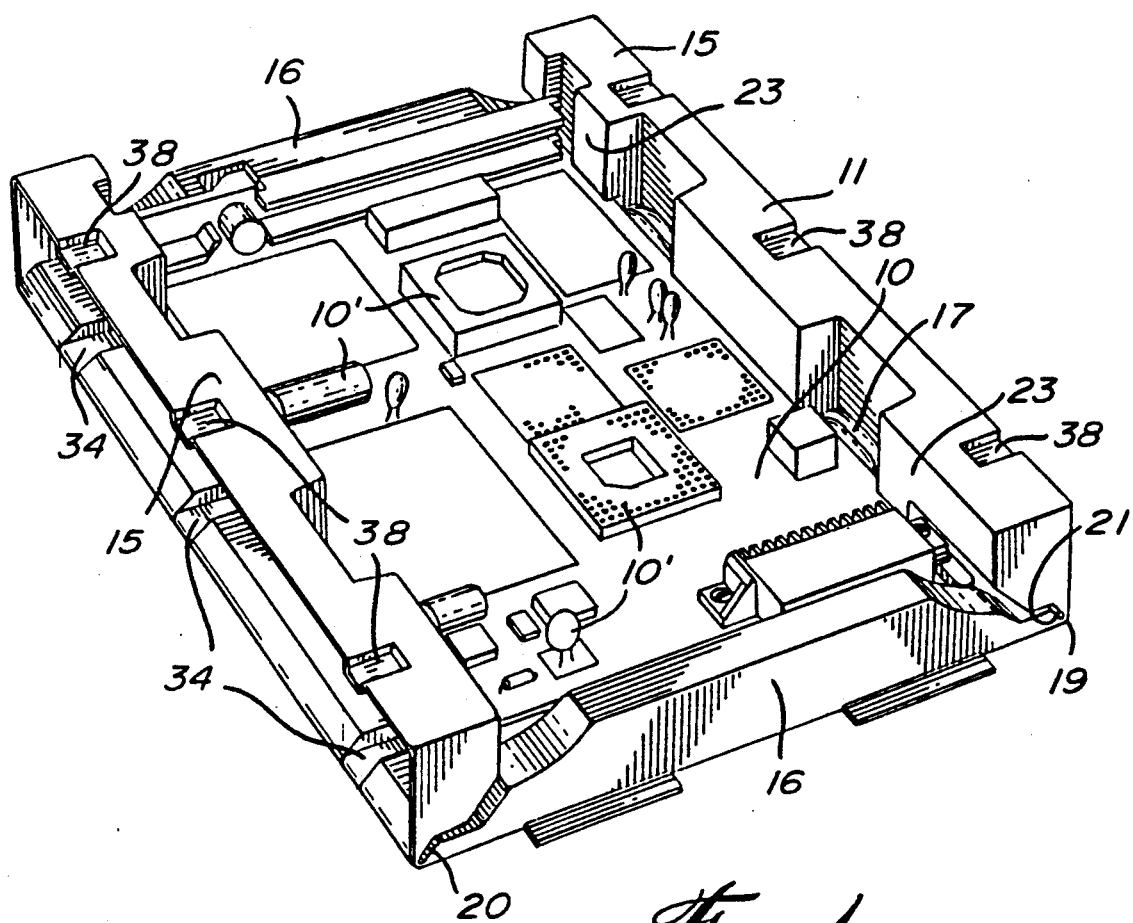
FIG. 1 is a perspective view illustrating a printed circuit board positioned in the support frame of the present invention.

Referring to the drawings and more particularly to FIG. 1, there is shown generally at 10, a printed circuit board clampingly retained in a support frame 11 whereby to protect the circuit board while it is shipped or handled by a person. The support frame 11 also protects and offers shock absorbing properties, particularly when positioned within a shipping container, as shown in FIG. 6. The printed circuit board support frame as herein shown is molded from a single thin plastic sheet by a thermoforming process, as is well known in the art. The thin sheet provides flexible properties to absorb shocks. The frame may also be molded of other suitable material, such as pulp material.

Referring now additionally to FIGS. 2 to 7, the printed circuit board support frame 11 has a base wall section 12 which is a flat rectangular section provided with elevated support ribs 13 formed in a top face 14 thereof. The printed circuit board 10 is disposed on these top ribs 13 and clamped thereon by hinged retention side wall members 15 which are formed integrally with the base wall section 12 along a pair of opposed parallel edges thereof. At the opposed end edges of the base wall section 12, there is provided stationary abutment end walls 16 which are also formed with the base wall section and extend transversely between the retention side wall members 15, as is better shown in FIG. 4. The support frame 11 is custom-designed for a specific circuit board to be shipped. It is pointed out that the dimensions and configuration of the support frame 11, the wall section 12, the support rib 13, and top face 14, as well as wall member 15 may vary from time to time in order to accommodate various printed circuit boards.

Elevated, spaced-apart abutment shoulders 17 are also disposed adjacent the elongated support ribs 13 and are elevated above the top face 18 of the support ribs 13, as shown in FIG. 4, whereby to retain the circuit board 10 in close fit therebetween, as illustrated in FIGS. 1 and 5. The abutment end wall 16 constitutes arresting means to prevent the circuit board from displacement in the transverse direction and provides ease of positioning the printed circuit board while packing. The board 10 is in close fit at its side and end edges between the abutment shoulders 17 and the abutment end walls 16.

Figure 7:
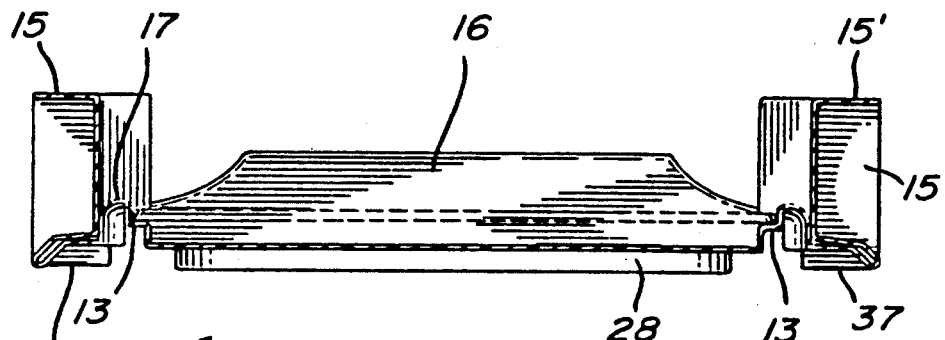
FIG. 7 is a section view across the support ribs formed in the base wall section.

Referring more specifically to FIGS. 4 and 5, it can be seen that the retention side wall members 15 are formed integrally with the base wall section 12 but spaced a predetermined distance along opposed side edges thereof. A straight creased hinge line 19 separates the side wall members from the base wall and permits the side wall members to be hinged towards the top face 20 of the base wall as shown in FIG. 5. The base wall section 12 protrudes beyond the abutment shoulders 17 and have a sloped edge wall 20 leading to the hinge line 19. The side wall member 15 has adjacent sloped edge wall 21 sloping upwardly from the hinge line 19 whereby these sloped edge walls 20 and 21 are positioned in facial arresting contact and form a strong ridge edge support, as shown in FIG. 7, when the retention side wall members 15 are maintained substantially upright, as shown in FIGS. 5 and 7, in their position of use.

Referring again to FIGS. 4 and 5, it can be seen that when the hinge retention side wall members 15 are hinged outwardly, the printed circuit board 10 can be introduced to fit snugly over the elevated support ribs 13 between the abutment shoulders 17 and the abutment end walls 16. When the circuit board is in this position, the opposed abutment shoulders 17 are hinged upwardly in the direction of arrows 22 to clamp the circuit board. As shown, the support ribs 13 are elongated ribs formed along opposed parallel edges of the base wall section. Each of the abutment wall members 15 are formed as a casement and provided with clamping shoulders 23 which project forwardly over respective one of the two elongated ribs 13 when the side wall members 15 are in their upright position of use. These clamping shoulders 23 each have a clamping notch 24 (see FIG. 4) in a lower edge thereof to receive an edge portion of the circuit board 10 to clamp the circuit board between the notch and the elongated ribs 13.

The side wall members 15 are maintained in a vertical position by an arresting means which may be constituted by the opposed side walls 29 of the rectangular shipping container 30, as shown in FIG. 6, or by connecting tabs 34 described later. This container also has a bottom wall 31 and a lockable hinged top wall or lid 32 with the hinge retention side wall members 15 of the support frame 11 having a flat upper wall 15', when in a vertical position. The side wall members 15 are dimensioned for close fit between the top wall 32 and the bottom wall 31. Accordingly, when the top wall is closed, the support frame 11 is immovable in the container and acts as a shock absorbing frame and spaces the printed circuit board 10 intermediate the side walls 29, the end walls 33 and the bottom and top walls 31 and 32 of the shipping container 30.

Figure 2:
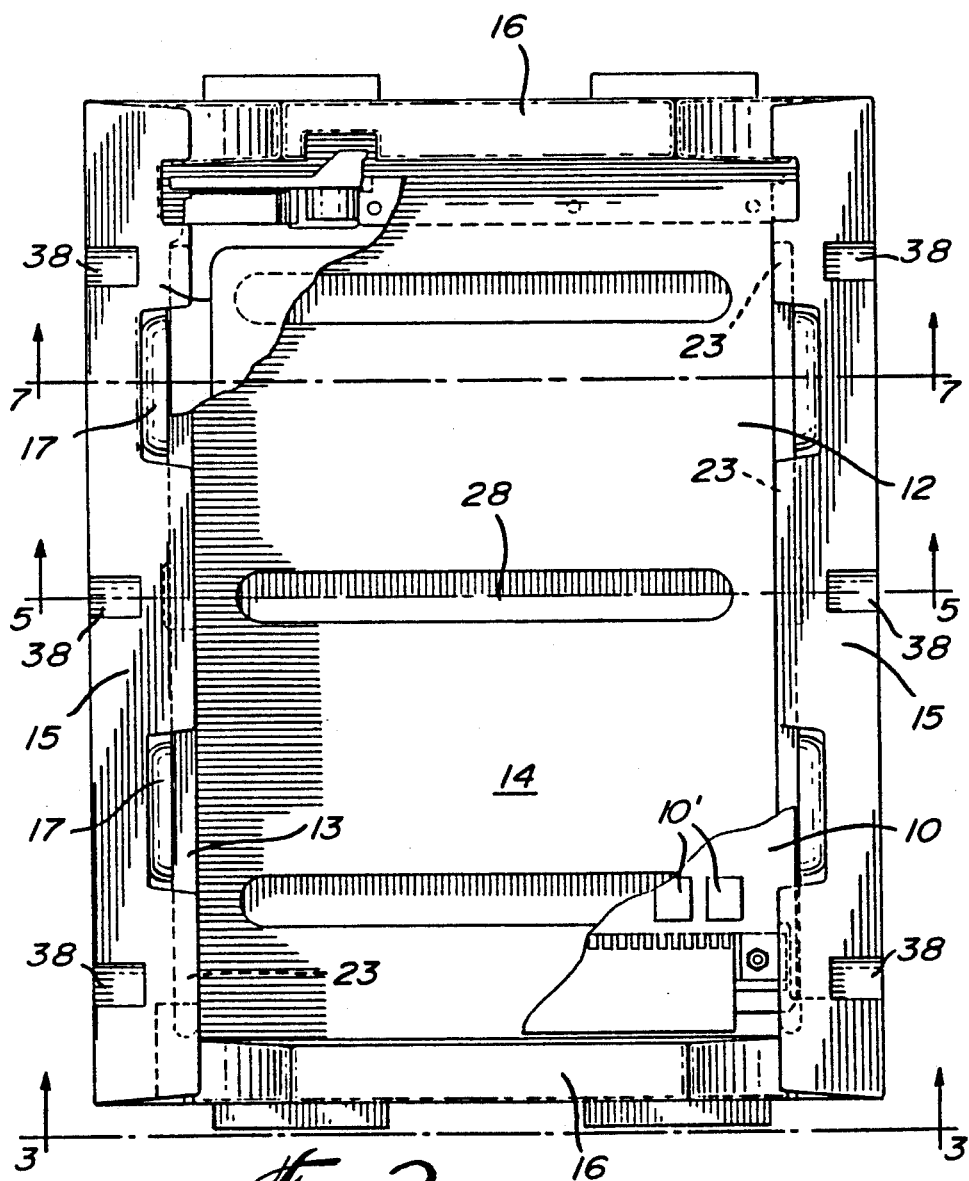
FIG. 2 is a top view of the printed circuit support frame shown with the hinged retention side wall members in a position of use to clamp a printed circuit board therebetween.

As shown in FIGS. 4 to 6, the bottom wall section 12 is also provided with two or more transverse shock absorbing bumpers 28 formed integral therewith and in a spaced-apart fashion, as better seen in FIG. 2. These bumpers provide shock absorbency and also strengthen the bottom wall section 12 to give it rigidity.

Figure 3:
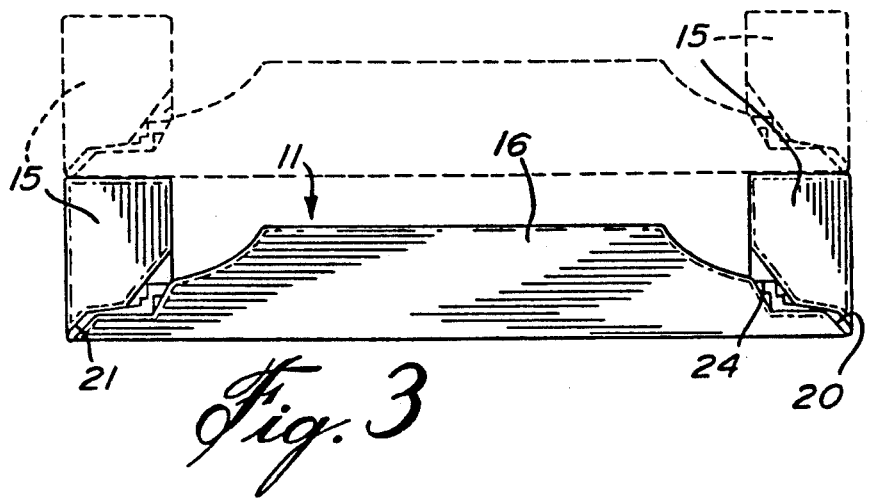
FIG. 3 is an end view of the printed circuit support frame and which also illustrates the stacking feature.

As illustrated in FIGS. 3, 4 and 5, the side wall members 15 may be provided with two or more spaced apart tabs 34 for friction fit retention in aligned cavities 35 provided in the abutment wall 36 between the hinge 19 and the shoulders 17. When the wall members 15 are raised to their vertical position, the tabs 34 are press-fitted in their respective cavities 35 to retain the wall member 15 upright with the circuit board in position. This permits the board to be manipulated while protected by the support frame.

The cavities 35 also serve as a dual purpose in that their outer surface 37 also constitutes legs which are positionable in locating cavities 38 provided in the top wall 15' of the side wall member 15. This permits for the stacking of two or more support frames 11 for shipping, storage or other purpose.

Another advantage of the support frame 11 is that the components 10' on the circuit board are facing upwardly and are visible to the user, making the boards readily identifiable without the need of having to flip the support frame upside down, risking the danger of the printed circuit board falling out of the frame.

It is within the ambit of the present invention to cover any obvious modifications of the preferred embodiment described herein, provided such modifications fall within the scope of the appended claims.

I claim:

1. A printed circuit board support frame in combination with a shipping container for protecting and transporting a printed circuit board, said support frame being molded from plastics material and comprising a base wall section having elevated support means projecting from a top face thereof for supporting said circuit board elevated from said base wall section, said base wall section having a hinged retention side wall member formed along a pair of opposed parallel edges thereof; said retention side wall members, when hinged outwardly of said base wall section, permitting said circuit board to be positioned on said support means elevated from said base wall section; said retention side wall members having one or more clamping means to overlie opposed top side edge portions of said circuit board when said side wall members are maintained in a vertical position to clamp said circuit board over said support means, said side wall members being maintained in said vertical position by opposed vertical side walls of said shipping container, and arresting means to prevent said circuit board from displacement.

2. A printed circuit board protection support frame as claimed in claim 1 wherein said arresting means is constituted by an abutment end wall formed at opposed ends of said base wall and extending along a transverse axis to said hinged retention side wall members, and at least one elevated abutment shoulder along opposed sides of said base wall for retaining said circuit board in close fit therebetween.

3. A printed circuit board protection support frame as claimed in claim 2 wherein said base wall is further provided with two or more shock absorbing bumpers protruding from a lower face of said base wall.

4. A printed circuit board protection support frame as claimed in claim 3 wherein said support frame is a thermoformed frame molded from a single plastic sheet.

5. A printed circuit board protection support frame as claimed in claim 1 wherein said elevated support means are support ribs disposed spaced apart to support said printed circuit board in a plane parallel to said base wall section.

6. A printed circuit board protection support frame as claimed in claim 5 wherein said base wall is a rectangular base wall, said arresting means being comprised by a plurality of abutment wall members disposed along straight axes on opposed side and end edges of said circuit board when positioned on said support ribs to arrest said board from planar displacement, said abutment wall members extending above the height of said support ribs.

7. A printed circuit board protection support frame as claimed in claim 6 wherein each said hinged retention side wall member is formed with said base wall in opposed side wall sections thereof, and a straight creased hinged line separating said side wall members from said base wall and permitting said side wall members to be hinged towards said top face of said base wall.

8. A printed circuit board protection support frame as claimed in claim 7 wherein said base wall is an elevated base wall, said base wall having a sloped edge wall to one side of said creased hinge line, said side wall member also having a sloped edge wall on an opposite side of said hinge line, said sloped edge wall being positioned in facial arresting contact when said wall member is hinged toward said top face to arrest same in a substantially transverse upright position.

9. A printed circuit board protection support frame as claimed in claim 7 wherein said support ribs are comprised by two elongated ribs each formed along one of said parallel edges of said base wall section and spaced inwardly thereof a predetermined distance whereby said printed circuit board will rest on said ribs along opposed edges thereof, said abutment wall members each having clamping shoulders projecting forwardly over a respective one of said two elongated ribs, said clamping shoulders each having a clamping notch in a lower edge thereof to receive an edge portion of said circuit board to clamp said circuit board between said notch and said elongated ribs when said side wall members are maintained in a vertical position.

10. A printed circuit board protection support frame as claimed in claim 9 wherein said side wall members are maintained in said vertical position by opposed side walls of a rectangular box of predetermined dimension.

11. A printed circuit board protection support frame as claimed in claim 10 wherein said side wall members are dimensioned for close fit between a bottom and top wall of said rectangular box whereby said circuit board is retained in a plane inside said box and spaced from said side wall, end walls and said bottom and top wall, said support frame providing shock absorbing properties to protect said printed circuit board.

12. A printed circuit board protection support frame as claimed in claim 10, wherein said side wall members are provided with tabs which are detachably securable in locking cavities in said base wall when said side wall members are hinged to said material position to maintain same in said vertical position.

13. A printed circuit board protection support frame as claimed in claim 12 wherein said side wall members are provided with interfitting stackable arms in a top and bottom surface thereof to permit vertical stacking of two or more of said support frames.

* * * * *